(12) United States Patent
Watanabe et al.

(10) Patent No.: US 7,245,513 B2
(45) Date of Patent: Jul. 17, 2007

(54) SEMICONDUCTOR INTEGRATED CIRCUIT DEVICE, CONTACTLESS ELECTRONIC DEVICE, AND HANDHELD TERMINAL

(75) Inventors: Kazuki Watanabe, Hino (JP); Yoshiki Kawajiri, Amagasaki (JP); Hisataka Tsunoda, Oma (JP)

(73) Assignee: Renesas Technology Corp., Tokyo (JP)

( * ) Notice: Subject to any disclaimer, the term of this patent is extended or adjusted under 35 U.S.C. 154(b) by 156 days.

(21) Appl. No.: 11/246,367

(22) Filed: Oct. 11, 2005

(65) Prior Publication Data

US 2006/0076626 A1 Apr. 13, 2006

(30) Foreign Application Priority Data

Oct. 13, 2004 (JP) ............... 2004-298548

(51) Int. Cl.
*H02M 7/217* (2006.01)
(52) U.S. Cl. .................. 363/108; 363/37; 323/313
(58) Field of Classification Search ............ 363/17–20, 363/97, 98, 37, 60, 126, 78, 108, 109; 323/312–316, 323/280, 281; 327/538, 541
See application file for complete search history.

(56) References Cited

U.S. PATENT DOCUMENTS

| | | | | |
|---|---|---|---|---|
| 5,180,928 A | * | 1/1993 | Choi | ............... 327/541 |
| 5,379,230 A | * | 1/1995 | Morikawa et al. | ............... 702/57 |
| 6,271,712 B1 | * | 8/2001 | Ball | ............... 327/531 |
| 6,333,864 B1 | * | 12/2001 | Nishimura et al. | ............... 363/78 |
| 6,566,847 B1 | * | 5/2003 | Chou et al. | ............... 323/282 |
| 6,831,378 B2 | * | 12/2004 | Watanabe et al. | ............... 307/149 |

FOREIGN PATENT DOCUMENTS

| | | |
|---|---|---|
| JP | 8-097366 | 9/1994 |
| JP | 2002-514377 | 11/1997 |
| JP | 2001-274339 | 3/2000 |
| WO | WO 98/24172 | 11/1997 |

* cited by examiner

*Primary Examiner*—Rajnikant B. Patel
(74) *Attorney, Agent, or Firm*—Reed Smith LLP; Stanley P. Fisher, Esq.; Juan Carlos A. Marquez, Esq.

(57) ABSTRACT

In a semiconductor integrated circuit device in which a rectifier device constituting a rectifier comprises a MOS transistor whose gate is connected to one antenna terminal and whose source is connected to the other antenna terminal, the parasitic capacitance applied between the antenna terminals increased. The present invention provides a technology for connecting a first MOS transistor whose gate is connected to a second input terminal between a first input terminal and a first output terminal, allowing an output terminal of a first bulk terminal control circuit, which is connected between the first and second input terminals, to control a bulk terminal of the first MOS transistor, and allowing an output terminal of a second bulk terminal control circuit, which is connected between the first and second input terminals, to control a bulk terminal of a second MOS transistor, which is connected between the second input terminal and the first output terminal.

9 Claims, 12 Drawing Sheets

SEMICONDUCTOR INTEGRATED CIRCUIT DEVICE, CONTACTLESS ELECTRONIC DEVICE, AND HANDHELD TERMINAL

CLAIM OF PRIORITY

The present application claims priority from Japanese application JP 2004-298548, filed on Oct. 13, 2004, the content of which is hereby incorporated by reference into this application.

BACKGROUND OF THE INVENTION

1. Field of the Invention

The present invention relates to a semiconductor integrated circuit device and contactless electronic device having a function of rectifying a signal received by an antenna coil, and more particularly to a technology suitable for a rectifier in a semiconductor integrated circuit device.

2. Description of the Related Arts

The so-called contactless electronic device, which incorporates a semiconductor integrated circuit device and an antenna in a card, causes the semiconductor integrated circuit device to exchange information with an interrogator, and implements various functions, for instance, of transmitting data retained by the contactless electronic device and retaining data transmitted from the interrogator.

The semiconductor integrated circuit device incorporated in the contactless electronic device uses the antenna, which is incorporated in the contactless electronic device, to receive a high-frequency signal that is supplied from the interrogator, rectifies and smoothes a voltage generated across the antenna, and generates an internal voltage that is necessary for the operation of internal circuitry.

When the employed rectifying device is a MOS transistor whose gate and source are connected to antenna terminals, the MOS transistor parasitic capacitance, which is represented by gate-to-source capacitance, is applied between the antenna terminals. Therefore, the parasitic capacitance acts as a resonant capacitance that is connected in parallel with an antenna coil (refer to Japanese Patent Laid-open No. 8-97366 and JP-A-2002-514377).

Japanese Patent Laid-open No. 8-97366 describes a rectifier that does not forward bias a parasitic bipolar transistor and can remarkably reduce a leak current.

JP-A-2002-514377 describes a rectifier that can reduce a drain-to-source voltage at the time of conduction by making use of the substrate effect of a MOS transistor threshold voltage.

Japanese Patent Laid-open No. 2001-274339 describes a rectifier that reduces the rectifying-device-induced voltage loss by adding a series regulator function to a rectifier that comprises a MOS transistor.

Prior to this patent application, the inventors of the present invention studied problems that arise when a semiconductor integrated circuit device having a rectifier whose rectifying device comprises a MOS transistor described in Japanese Patent Laid-open No. 8-97366, JP-A-2002-514377, or Japanese Patent Laid-open No. 2001-274339 was applied to a contactless electronic device.

SUMMARY OF THE INVENTION

Problems with a rectifier that comprises the studied MOS transistor will now be described.

Figure 1:
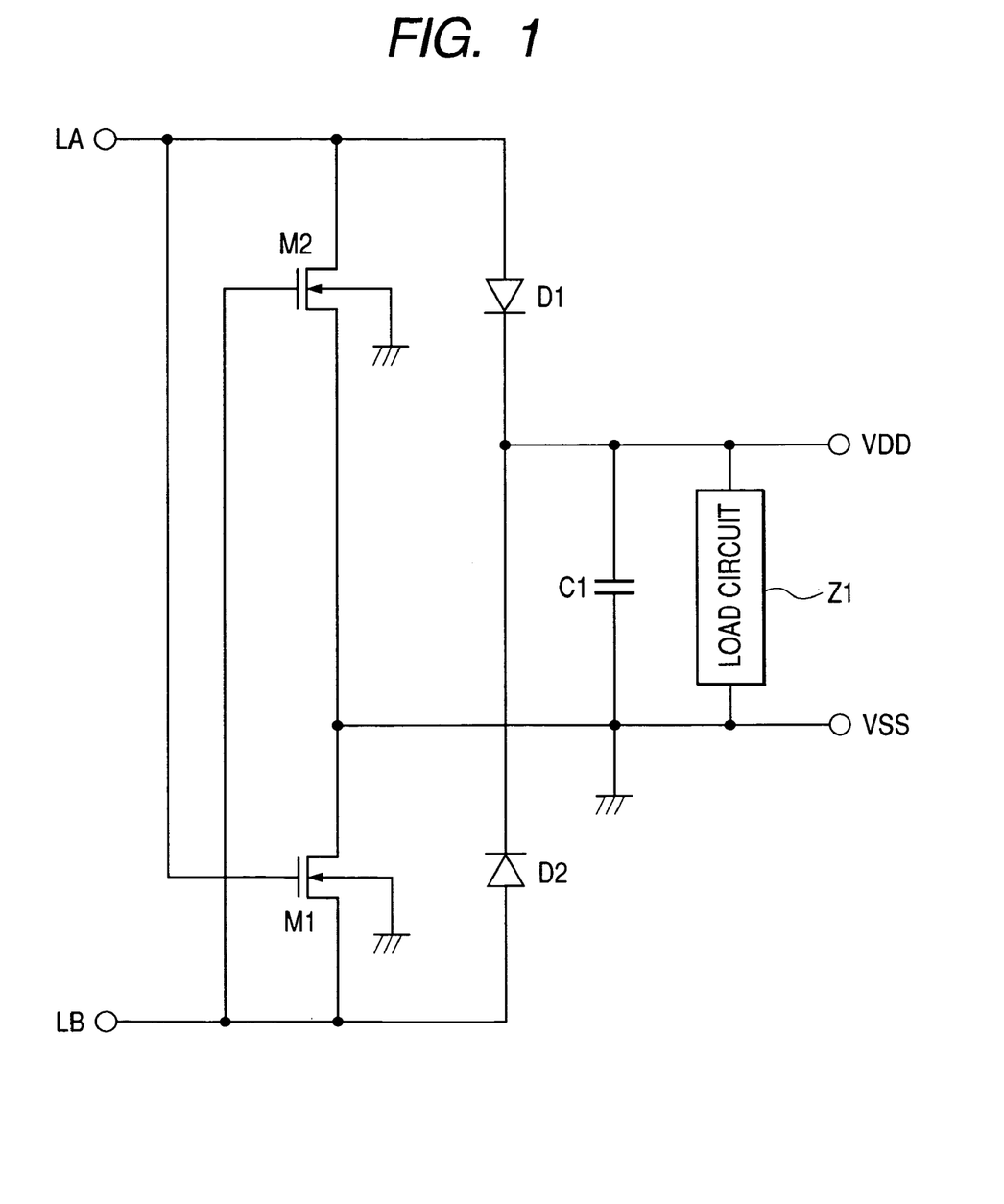
FIG. 1 shows a typical rectifier that comprises conventional MOS transistors.

FIG. 1 shows a typical rectifier that comprises conventional MOS transistors. MOS transistors M1 and M2, whose gate and source are connected to antenna terminals, operate as rectifying devices on the low potential side. Diodes D1 and D2 operate as rectifying devices on the high potential side. An alternate current, which is input between the antenna terminals, is rectified by MOS transistors M1 and M2 and diodes D1 and D2. The voltage generated between output terminals VDD and VSS of the rectifier is smoothed by a smoothing capacitance C1 and supplied as a power supply voltage for a load circuit Z1. In the example shown in FIG. 1, the low potential side output terminal VSS of the rectifier is handled as a ground potential within a chip.

Figure 2:
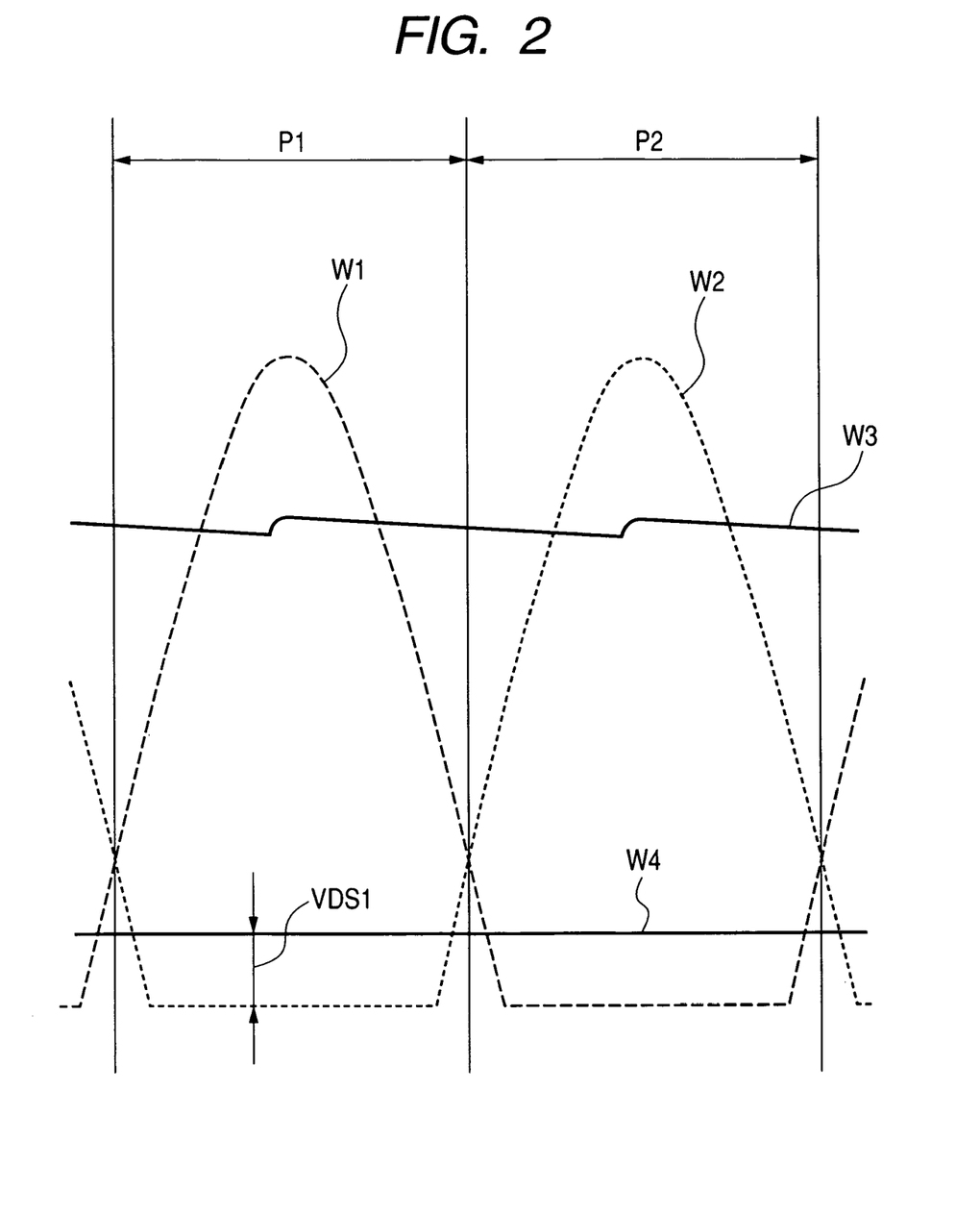
FIG. 2 shows typical operating waveforms of the rectifier shown in FIG. 1.

FIG. 2 shows voltage waveforms of antenna terminals LA and LB and output terminals VDD and VSS in the rectifier shown in FIG. 1. In FIG. 2, symbol W1 denotes the voltage waveform of antenna terminal LA; W2, the voltage waveform of antenna terminal LB; W3, the voltage waveform of high potential side output terminal VDD of the rectifier; W4, the voltage waveform of low potential side output terminal VSS of the rectifier; P1, the period during which the potential of antenna terminal LA is higher than that of antenna terminal LB; and P2, the period during which the potential of antenna terminal LA is lower than that of antenna terminal LB.

Figure 3:
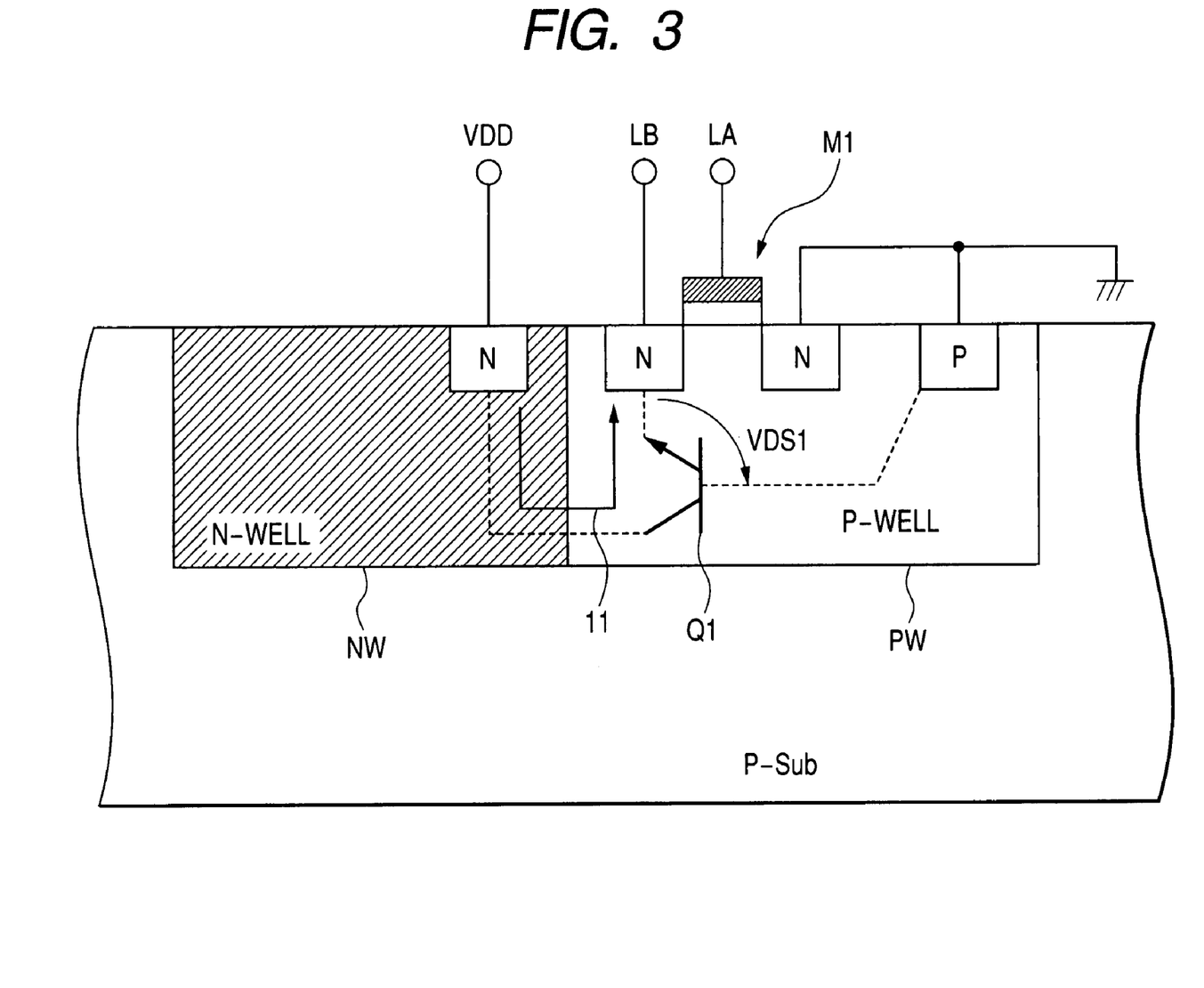
FIG. 3 illustrates the vertical structure of MOS transistor M1, which comprises the rectifier shown in FIG. 1.

FIG. 3 illustrates the vertical structure of MOS transistor M1, which comprises the rectifier shown in FIG. 1. A parasitic npn transistor Q1 is formed by a p-well PW in which MOS transistor M1 is formed, an n-diffusion layer that forms the source of MOS transistor M1 during period P1, and an n-well NW that is adjacent to a p-well layer in which MOS transistor M1 is formed. A PMOS transistor or the like, which forms a load circuit, is formed in the n-well NW. Further, a ground potential is applied to the p-well PW, and the high potential side output terminal of the rectifier is connected to the n-well NW.

As shown within period P1 in FIG. 2, when a large current flows to a circuit connected between the output terminals of the rectifier, the drain-to-source voltage VDS1 is increased by the drain-to-source resistance of the MOS transistor. Therefore, the substrate potential of MOS transistor M1 is higher than that of the source so that a base current flows between the base and emitter of the parasitic npn transistor Q1. As a result, a collector current I1 flows.

During period P1, the collector current I1 flows from output terminal VDD of the rectifier to antenna terminal LB. Therefore, this collector current becomes a leak current that flows from antenna terminal LA to antenna terminal LB via diode D1 during period P1. Thus, the rectification efficiency lowers.

In MOS transistor M2, a parasitic npn transistor is formed during period P2 so that a leak current arises to lower the rectification efficiency.

It is conceivable that a decrease in the rectification efficiency can be avoided by enlarging the transistor sizes of MOS transistors M1 and M2. When the transistor sizes of MOS transistors M1 and M2 are enlarged, it is possible to prevent the drain-to-source voltage VDS1 from increasing even when a large current flows. Further, the base-to-emitter voltage of the parasitic npn transistor Q1 increases. Thus, the base-to-emitter current of the parasitic npn transistor Q1 becomes negligible so that the leak current can be reduced.

However, when the transistor sizes of MOS transistors M1 and M2 are enlarged, the MOS transistor parasitic capacitance, which is represented by the gate-to-source capacitance, increases, thereby increasing the resonant capacitance that is connected in parallel with the antenna coil.

Therefore, when MOS transistors whose gate and source are connected to antenna terminals are employed as rectifying devices, the parasitic capacitance applied between the antenna terminals increases to decrease the maximum resonant frequency of the antenna coil. Thus, the inductance of the antenna coil needs to be decreased.

It is an object of the present invention to provide a rectifier whose parasitic capacitance to be applied between antenna terminals is small.

A representative aspect of the present invention will now be summarized. A first MOS transistor whose gate is connected to a second input terminal is connected between a first input terminal and a first output terminal. A bulk terminal of the first MOS transistor is controlled by the output terminal of a first bulk terminal control circuit that is connected between the first input terminal and the second input terminal. A second MOS transistor whose gate is connected to the first input terminal is connected between the second input terminal and the first output terminal. A bulk terminal of the second MOS transistor is controlled by the output terminal of a second bulk terminal control circuit that is connected between the first input terminal and the second input terminal. A first unidirectional device is connected between the first input terminal and the second output terminal. A second unidirectional device is connected between the second input terminal and the second output terminal. Consequently, a function of rectifying an alternate current that is input between the first and second input terminals is provided.

Advantages provided by a representative aspect of the present invention will now be summarized. A semiconductor integrated circuit device according to the present invention and a contactless electronic device and handheld terminal that employ the semiconductor integrated circuit device are capable of decreasing the parasitic capacitance to be applied between terminals for antenna connection and increasing the inductance of an antenna that is connected to the antenna terminals.

DETAILED DESCRIPTION OF THE PREFERRED EMBODIMENTS

The semiconductor integrated circuit device and contactless electronic device according to the present invention will now be described with reference to the accompanying drawings.

First Embodiment

Figure 4:
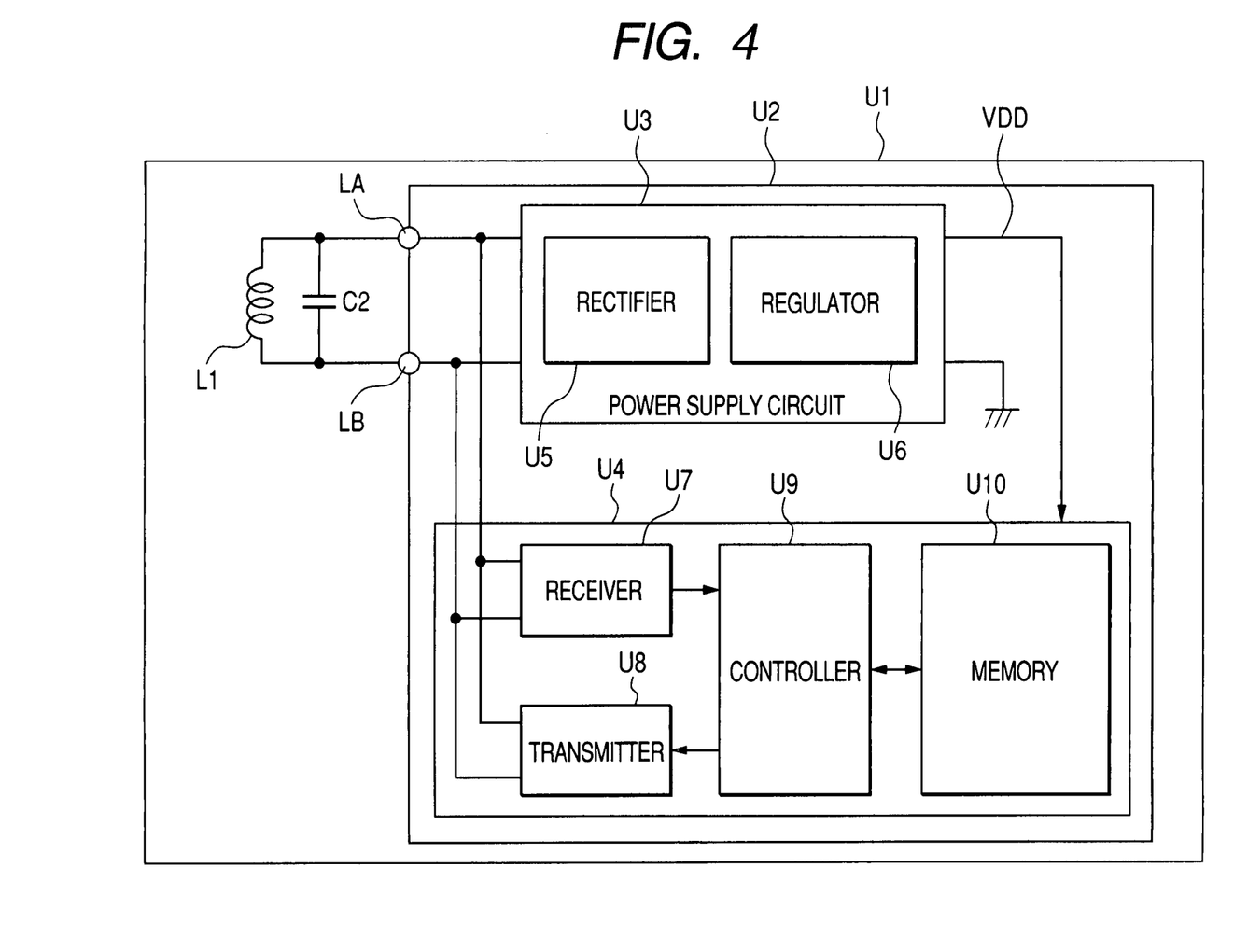
FIG. 4 illustrates the basic configuration of a first embodiment of a semiconductor integrated circuit device and contactless electronic device according to the present invention.

FIG. 4 is a block diagram illustrating the basic configuration of a first embodiment of a semiconductor integrated circuit device and contactless electronic device according to the present invention.

In FIG. 4, symbol U1 denotes a contactless electronic device; U2, a semiconductor integrated circuit device incorporated in the contactless electronic device U1; and L1, an antenna incorporated in the contactless electronic device U1. A capacitor C2, which is connected in parallel with the antenna L1, constitutes a resonance circuit. The semiconductor integrated circuit device U2 includes a power supply circuit U3, an internal circuit U4, and antenna terminals LA and LB for connecting to the antenna L1.

Figure 5:
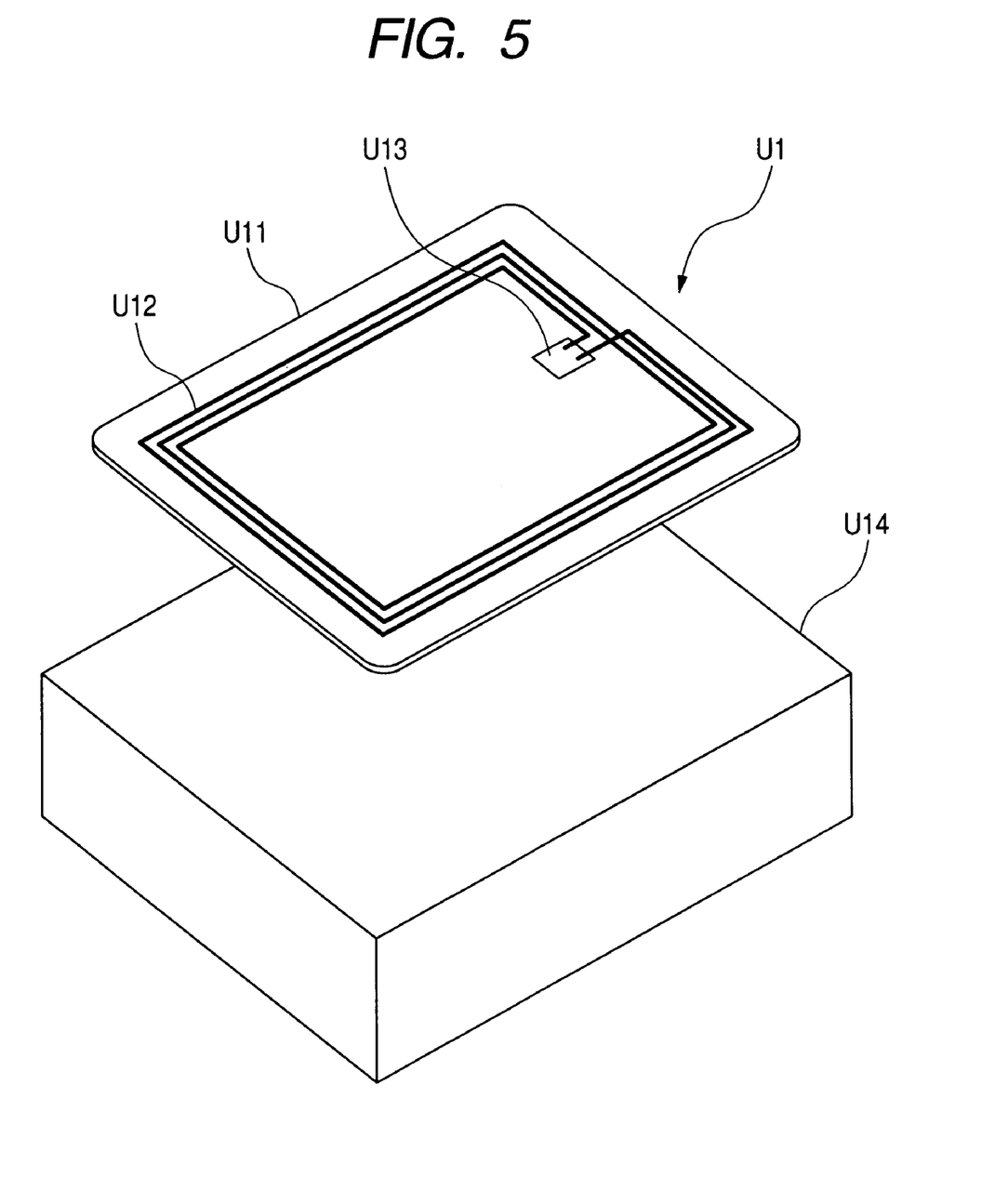
FIG. 5 is a perspective view illustrating an interrogator and a wiring substrate of a contactless electronic device that includes an antenna and a semiconductor integrated circuit device according to the present invention.

FIG. 5 shows the structure of the contactless electronic device U1. The contactless electronic device U1 is in the form of a card due to the use of a resin-molded printed circuit board U11. The antenna L1, which receives electromagnetic waves from an external interrogator U14, is formed by a spiral coil U12 that is formed by the wiring on the printed circuit board U11. The semiconductor integrated circuit device U2, which comprises an IC chip U13, is mounted on the printed circuit board U11. The IC chip U13 is connected to the coil U12 that serves as the antenna.

Upon receipt of an electromagnetic wave from the interrogator U14, the antenna L1 outputs a high-frequency alternate current to antenna terminals LA and LB. The alternate current is partially modulated by an information signal (data).

The present invention is typically applied to a contactless electronic device whose surface is not provided with an input/output terminal relative to the outside, that is, the so-called contactless IC card. It goes without saying that the present invention can also be applied to a dual type IC card, which has a contactless interface and input/output terminal.

The semiconductor integrated circuit device U2 may be formed on, although not limited to, a semiconductor substrate made of monocrystal silicon due to the use of a publicly known semiconductor integrated circuit device manufacturing technology.

Figure 6:
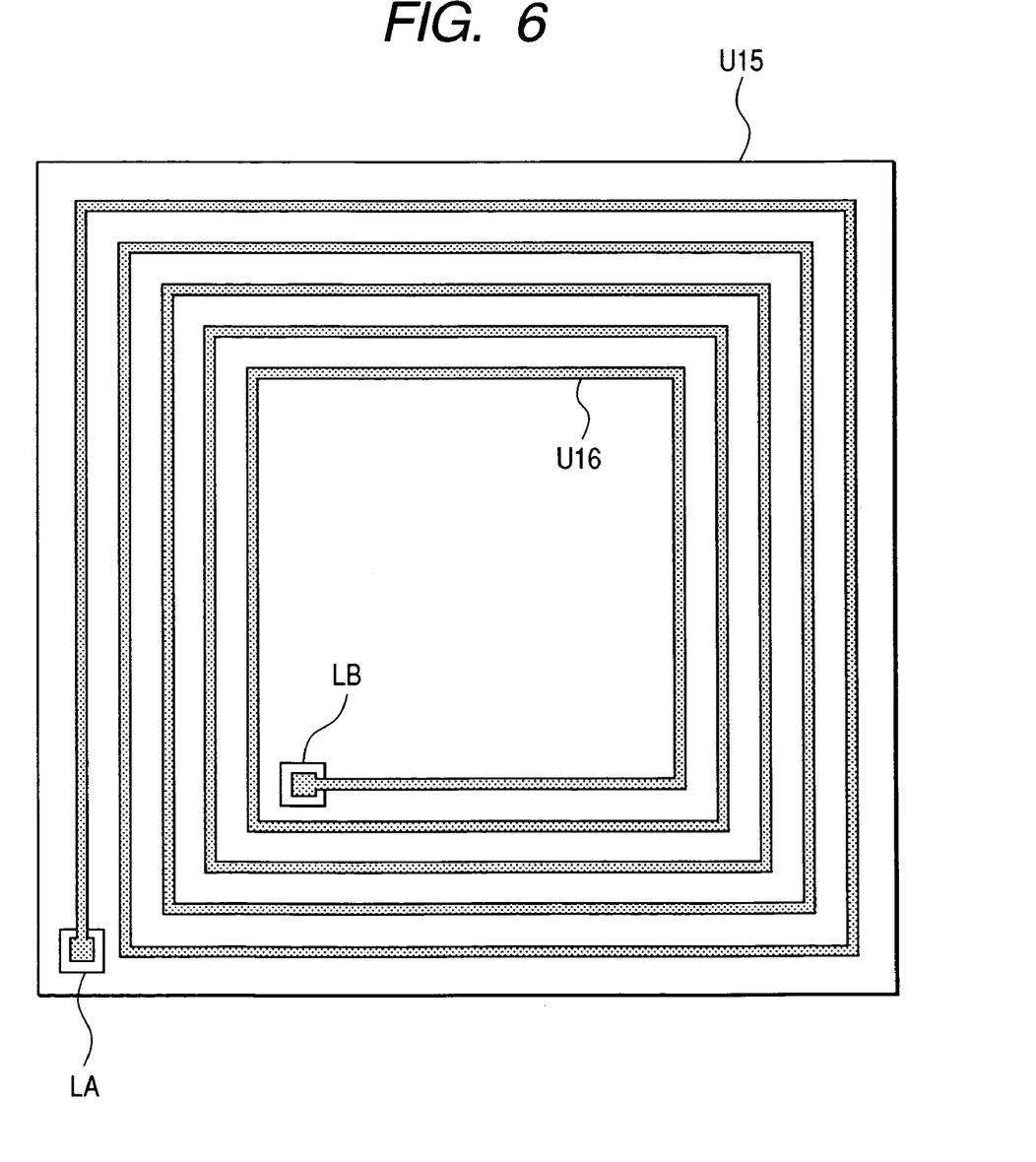
FIG. 6 is a top view illustrating a semiconductor integrated circuit device that includes an antenna coil, which is formed by a wiring layer on a chip.

FIG. 6 shows the structure of an antenna coil that is formed on the semiconductor integrated circuit device shown in FIG. 1. The antenna L1, which receives electromagnetic waves from an external interrogator, is formed by a spiral coil U16 that is formed by a wiring layer on the semiconductor integrated circuit device U15, and connected to antenna terminals LA and LB on the semiconductor integrated circuit device U15. As described above, the contactless electronic device is not limited to a contactless IC card that is in the form of a card.

Referring to FIG. 4, the power supply circuit U3 basically comprises a rectifier U5 and a smoothing capacitor. It goes without saying that a regulator U6 may be employed to exercise control so that the voltage VDD output from the power supply circuit U3 does not exceed a predetermined voltage level. The voltage VDD output from the power supply circuit U3 is supplied as the power supply voltage VDD for the internal circuit U4. The internal circuit U4 comprises a receiver circuit U7, a transmitter circuit U8, a controller U9, and a memory U10. The receiver circuit U7 demodulates an information signal that is superposed over an alternate current received by the antenna L1 incorporated in the contactless electronic device, and supplies the demodulated information signal to the controller U9 as a digital information signal. The transmitter circuit U8 receives a digital information signal that is output from the controller U9, and modulates the alternate current received by the antenna L1 with the information signal. When the reflection of the electromagnetic wave from the antenna L1 changes due to the above modulation, the interrogator U14 receives the information signal from the controller U9.

The memory U10 is used, for instance, to record transmitted data and information data that is demodulated in relation to the controller U9.

Figure 7:
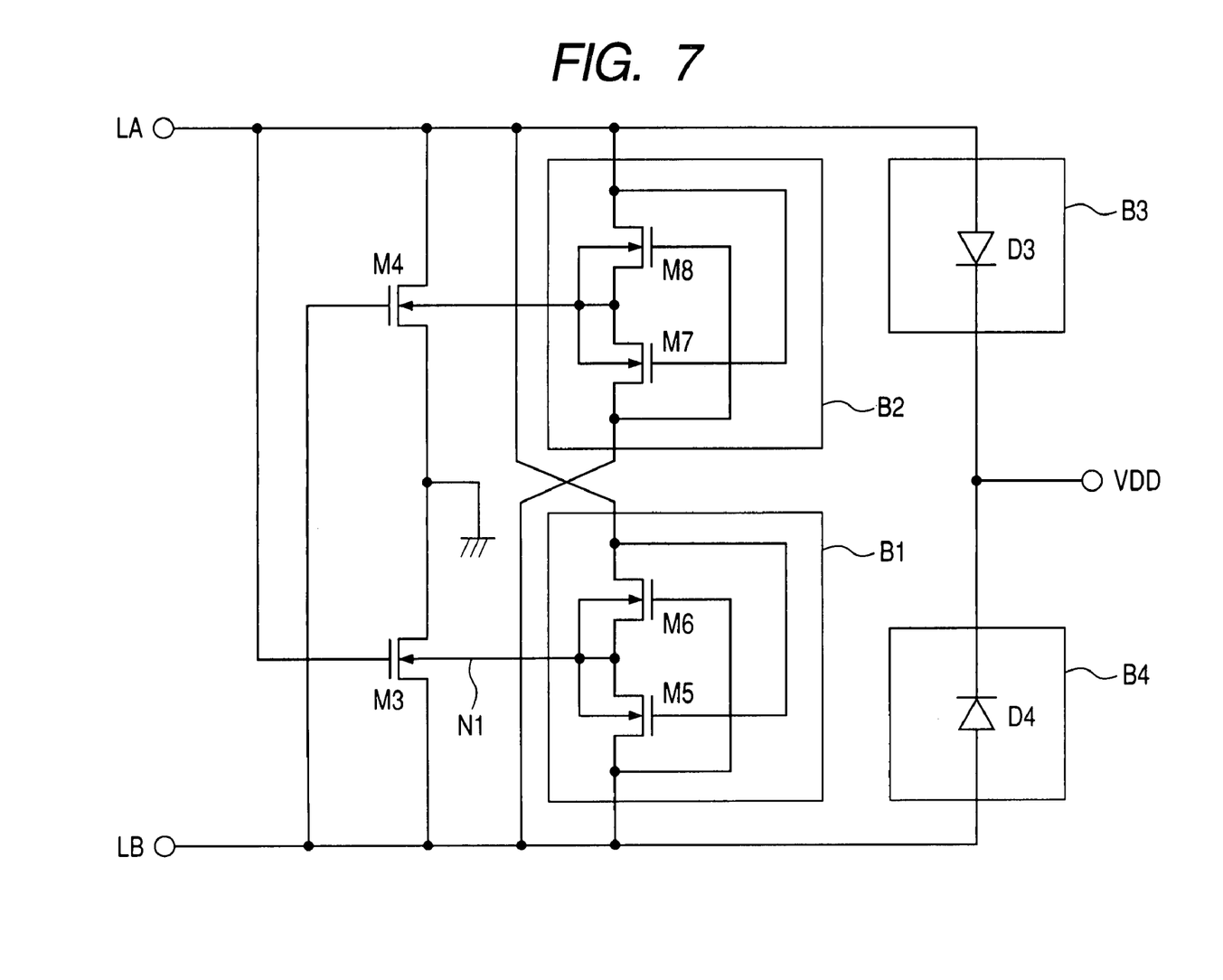
FIG. 7 is a basic configuration diagram illustrating a rectifier that is incorporated in the first embodiment of a semiconductor integrated circuit device.

FIG. 7 is a basic configuration diagram illustrating a rectifier that is incorporated in the semiconductor integrated circuit device according to the present embodiment.

The configuration of the rectifier according to the present embodiment will now be described. MOS transistor M3 whose gate is connected to antenna terminal LA is connected between antenna terminal LB and the low potential side output terminal VSS of the rectifier. The bulk terminal of MOS transistor M3 is connected to an output terminal of bulk terminal control circuit B1 that is connected between antenna terminals LA and LB. MOS transistor M5 whose gate is connected to antenna terminal LA is connected between antenna terminal LB and the output terminal of bulk terminal control circuit B1. MOS transistor M6 whose gate is connected to antenna terminal LB is connected between antenna terminal LA and the output terminal of bulk terminal control circuit B1. MOS transistor M4 whose gate is connected to antenna terminal LB is connected between antenna terminal LA and the low potential side output terminal VSS of the rectifier. The bulk terminal of MOS transistor M4 is connected to the output terminal of bulk terminal control circuit B2, which is connected between antenna terminals LA and LB. The circuit configuration of bulk terminal control circuit B2 is the same as that of bulk terminal control circuit B1, which comprises MOS transistors M7 and M8. Unidirectional device B3, which comprises pn-junction diode D3, is connected between antenna terminal LA and the high potential side output terminal VDD of the rectifier. Unidirectional device B4, which comprises pn-junction diode D4, is connected between antenna terminal LB and the high potential side output terminal VDD of the rectifier.

Figure 8:
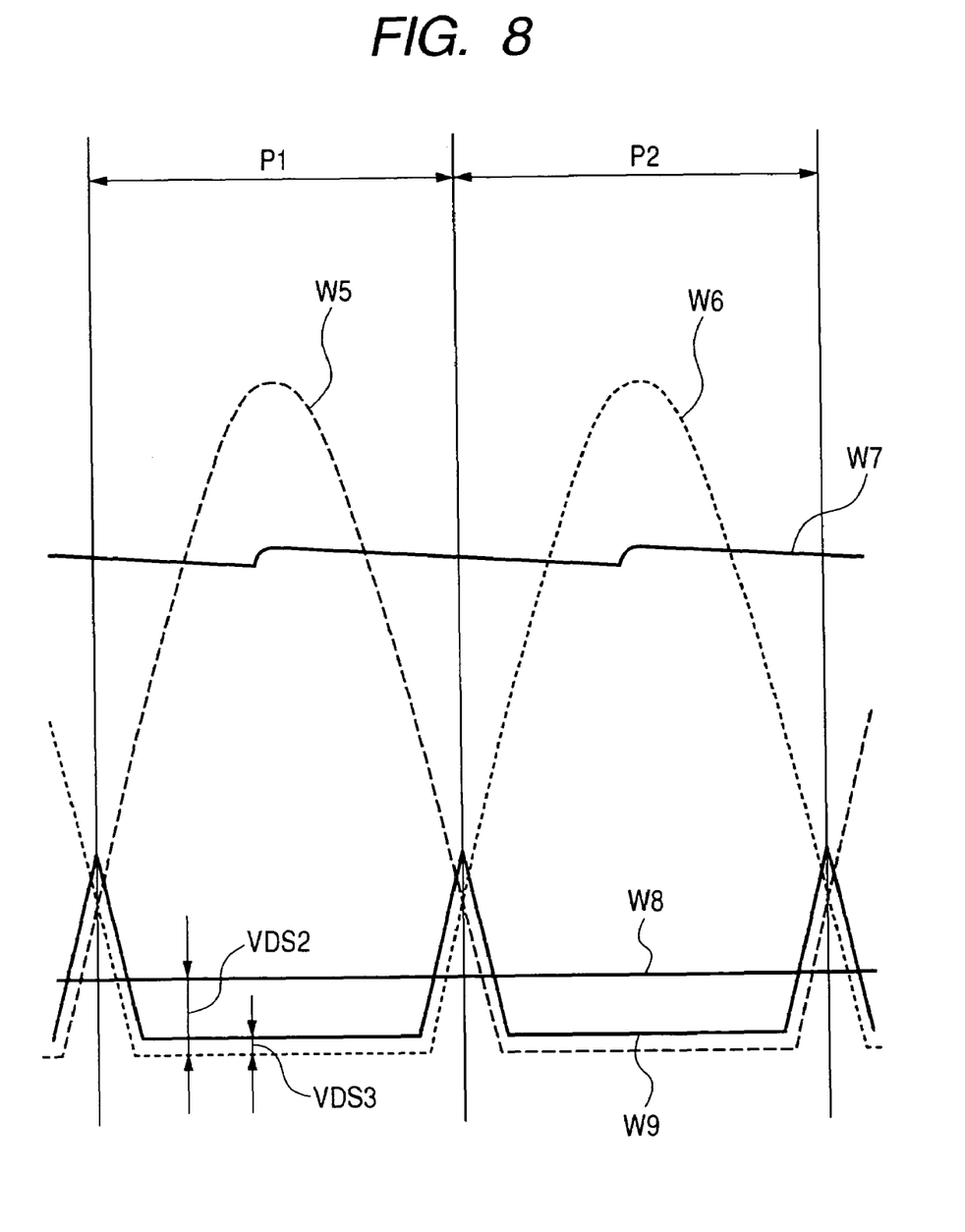
FIG. 8 shows typical operating waveforms of the rectifier shown in FIG. 7.

FIG. 8 shows voltage waveforms of terminals in the rectifier shown in FIG. 7. In FIG. 8, symbol W5 denotes a voltage waveform of antenna terminal LA; W6, a voltage waveform of antenna terminal LB; W7, a voltage waveform of the high potential side output terminal VDD of the rectifier; W8, a voltage waveform of the low potential side output terminal VSS of the rectifier; W9, a voltage waveform of the output terminal of the bulk terminal control circuit; P1, a period during which the potential of antenna LA is higher than that of antenna terminal LB; and P2, a period during which the potential of antenna LA is lower than that of antenna terminal LB.

Figure 9:
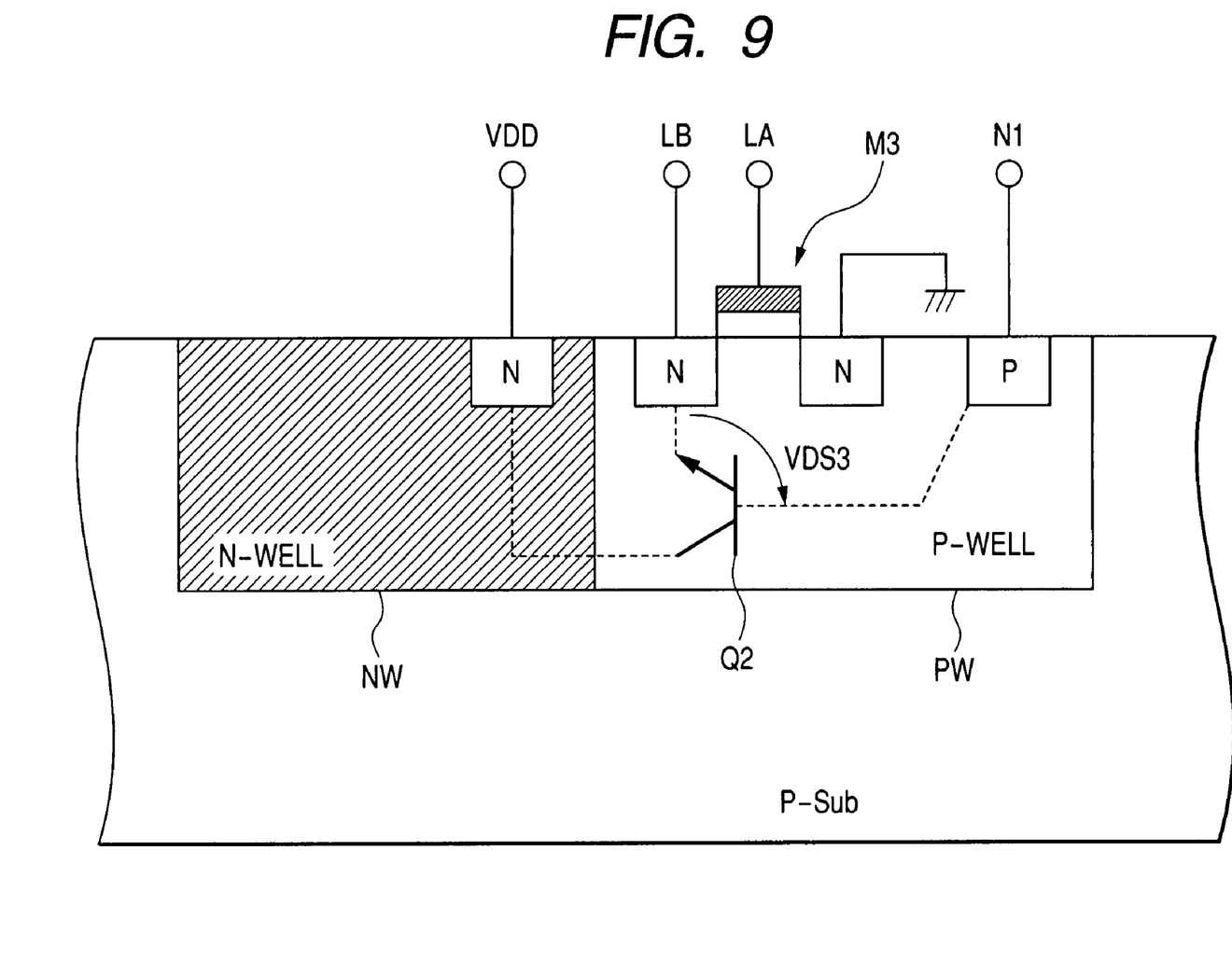
FIG. 9 illustrates the vertical structure of MOS transistor M1, which comprises the rectifier shown in FIG. 7.

FIG. 9 illustrates the vertical structure of MOS transistor M3, which comprises the rectifier shown in FIG. 7. A parasitic npn transistor Q2 is formed by a p-well PW in which MOS transistor M3 is formed, an n-diffusion layer that forms the source of MOS transistor M3 during period P1, and an n-well NW that is adjacent to the p-well PW in which MOS transistor M3 is formed. The output terminal N1 of bulk terminal control circuit B1 is connected to the p-well PW, and the high potential side output terminal VDD of the rectifier is connected to the n-well NW.

If a large current flows to a circuit that is connected between the rectifier output terminals as indicated during period P1 in FIG. 8, the drain-to-source voltage VDS2 for MOS transistor M3 increases.

Meanwhile, bulk terminal control circuit B1 operates so that the bulk terminal of MOS transistor M3 has the same potential as the low potential side of antenna terminals LA and LB. The bulk terminal potential of MOS transistor M3 is irrelevant to the circuit connected between the rectifier output terminals and independently controlled.

In the above instance, the voltage applied between the base and emitter of the parasitic npn transistor Q2 shown in FIG. 9 is equal to the drain-to-source voltage of MOS transistor M5. Since no steady current flows between the drain and source of MOS transistor M5, the drain-to-source voltage V3 is extremely low. Therefore, no base current flows to the npn transistor Q2, thereby indicating that no collector current I2 flows.

During period P2, MOS transistor M4 performs the same operation as described above.

Thus, no leak current is generated between the high potential side output terminal of the rectifier and the antenna terminal, which are described with reference to FIG. 1. Consequently, it is possible to reduce the transistor sizes of MOS transistors M3 and M4.

Even when MOS transistors whose gate and source are connected to antenna terminals are used as rectifying devices, the transistor sizes can be reduced. Thus, the parasitic capacitance to be applied between the antenna terminals can be decreased. As a result, the degree of design freedom for the inductance of the antenna coil L1 connected between the antenna terminals can be enhanced.

Further, MOS transistors constituting bulk terminal control circuits B1 and B2 do not invoke a steady current flow. Therefore, the MOS transistor sizes can be reduced, and the influence on the parasitic capacitance applied between the antenna terminals is extremely small.

Second Embodiment

Figure 10:
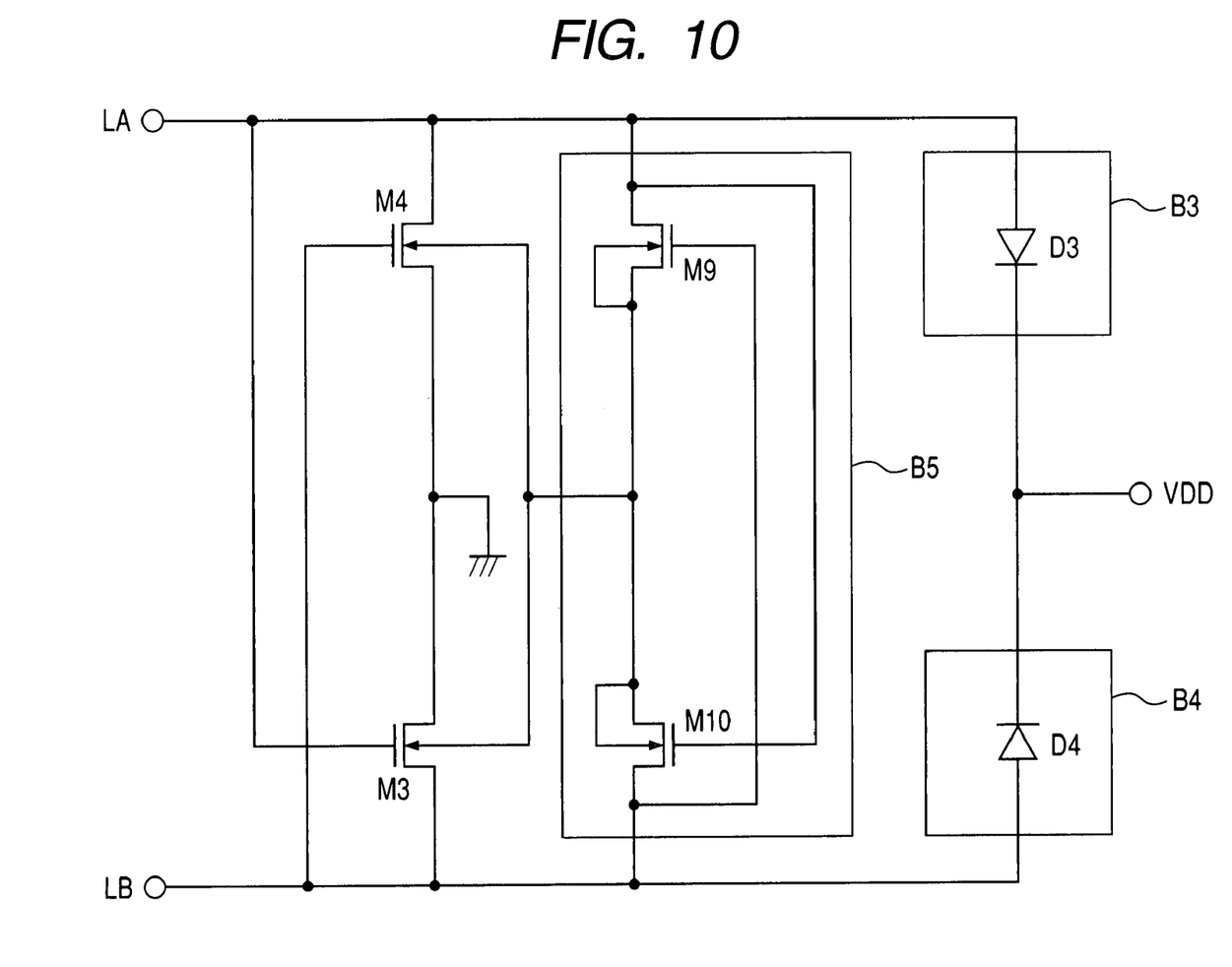
FIG. 10 is a circuit diagram illustrating another configuration of the rectifier shown in FIG. 7.

FIG. 10 is a circuit diagram illustrating another configuration of the rectifier shown in FIG. 7.

The configuration of the rectifier according to a second embodiment will now be described. The bulk terminal for MOS transistors M3 and M4, which are shown in FIG. 7, is connected to the output terminal of bulk terminal control circuit B5, which comprises MOS transistor M9 whose gate and source are connected to antenna terminals LA and LB, respectively, and MOS transistor M10 whose gate and source are connected to antenna terminals LB and LA, respectively.

In other words, the rectifier according to the second embodiment is provided with bulk terminal control circuit B3, which is obtained by integrating bulk terminal control circuits B1 and B2 into a single whole. Bulk terminal control circuits B1 and B2 are provided for MOS transistors M3 and M4, which constitute the low potential side rectifying device within the rectifier shown in FIG. 7.

When the configuration described above is employed, it is possible to provide the same advantages as described with reference to FIG. 7, reduce the number of bulk terminal control circuits to half, and decrease the chip area.

Third Embodiment

Figure 11:
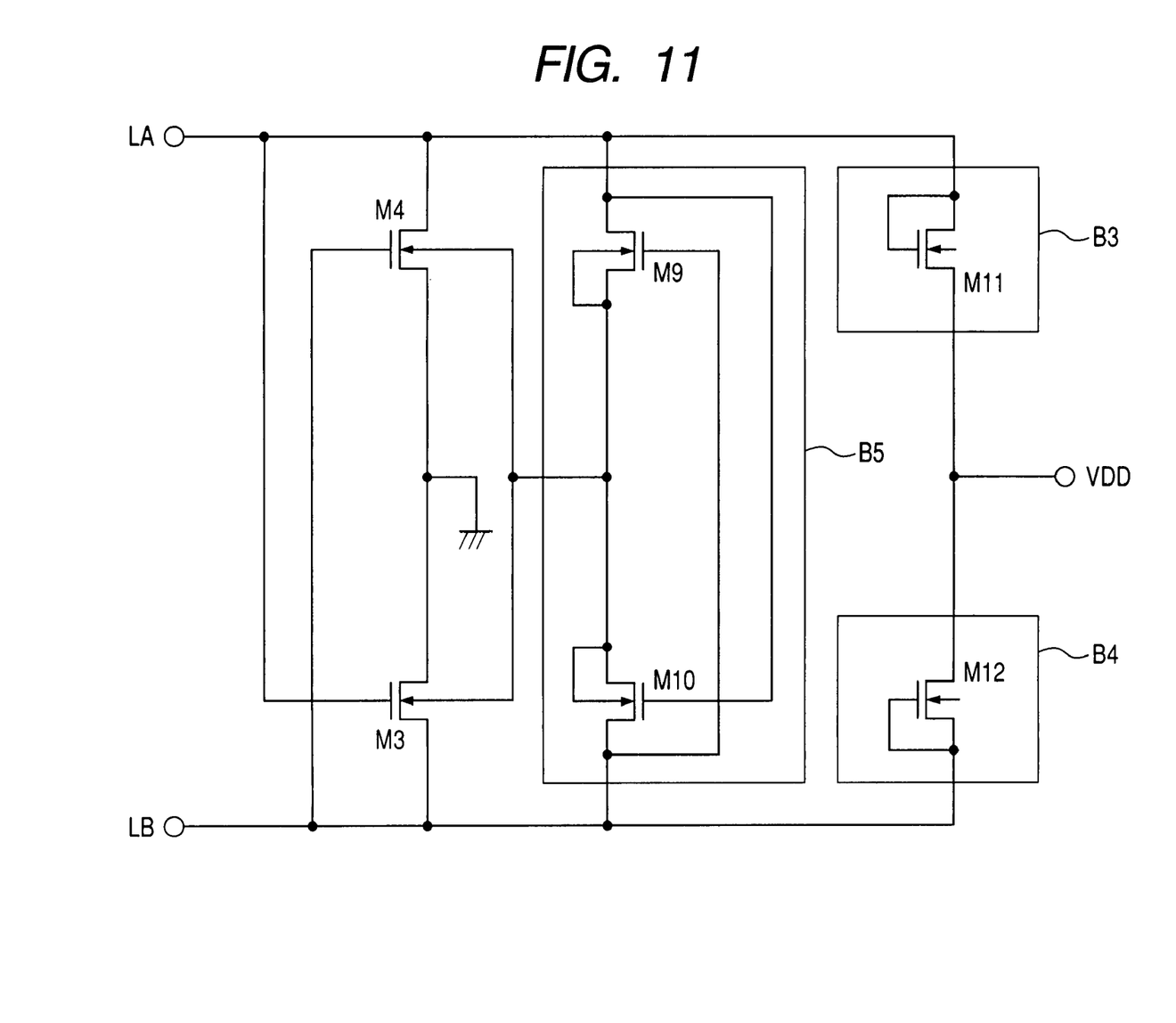
FIG. 11 is a circuit diagram illustrating another configuration of a unidirectional device that constitutes the rectifier shown in FIG. 7.

FIG. 11 is a circuit diagram illustrating another configuration of a unidirectional device that constitutes the rectifier shown in FIG. 7.

The rectifier according to a third embodiment is obtained when unidirectional devices B3 and B4, which are shown in FIG. 7, comprise MOS transistors M11 and M12 whose gate and source are interconnected.

When MOS transistors are used as described above, the rectifier can be readily mounted in a standard CMOS process of a semiconductor integrated circuit device that includes a logic circuit. Further, it is also possible to additionally incorporate the series regulator function that is described in Japanese Patent Laid-open No. 2001-274339.

Fourth Embodiment

Figure 12:
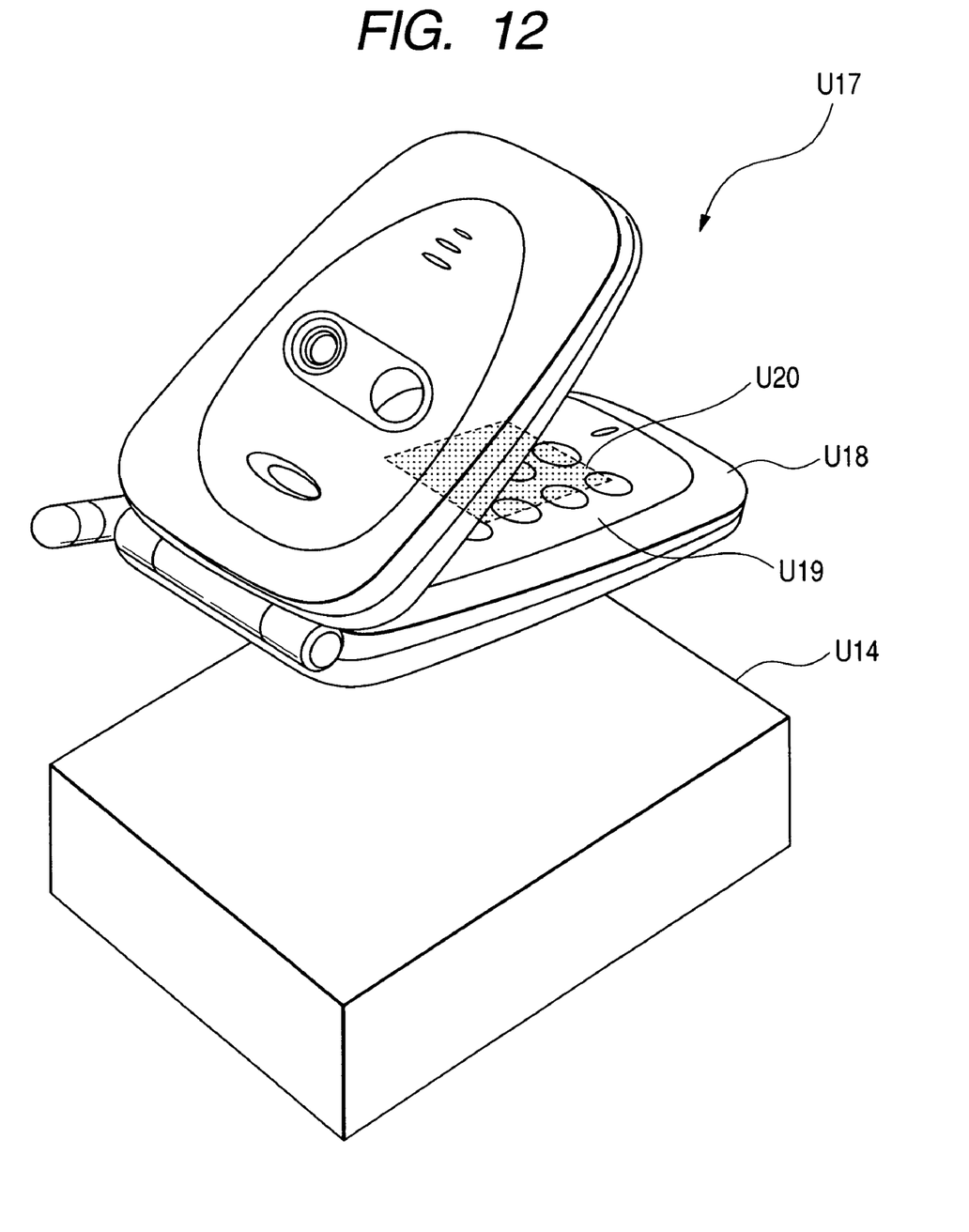
FIG. 12 is a perspective view of a cellular phone, which is used to describe a fourth embodiment.

FIG. 12 illustrates a handheld terminal according to a fourth embodiment of the present invention, which incorporates a contactless electronic device according to the first, second, or third embodiment.

In FIG. 12, symbol U17 denotes a cellular phone that serves as the handheld terminal; U18, a folding-type housing for the cellular phone U17; U19, a data input device that is mounted on the inner surface of a main body for the housing U18; and U20, a contactless electronic device that is positioned inside the housing U18 and mounted on the back of the input device U19. A display device (not shown in FIG. 12) is mounted on the inner surface of a cover for the housing U18. Further, a transmitter/receiver circuit and a data processing circuit are mounted inside the cover for the housing U18 to establish audio or data communication. The display device displays, for instance, data that is input into or output from the data processing circuit.

The contactless electronic device U20 includes a data output terminal and a power supply voltage input terminal, and is connected to the data processing circuit via these terminals. The data of an internal circuit within the contactless electronic device U20 can be displayed on the display device by operating the input device U19.

When positioned near the interrogator U14, the contactless electronic device U20 exchanges data with the interrogator U14 no matter whether the cellular phone U17 is turned on. The contactless electronic device U20 may be incorporated in such a manner that it is detachable from the cellular phone U17.

The present embodiment makes it possible to acquire the data possessed by the contactless electronic device U20 without via the interrogator, thereby enhancing the user-friendliness of the contactless electronic device U20.

In the present embodiment, the contactless electronic device U20 is built in the cellular phone U17. Alternatively, however, the contactless electronic device U20 may be built in a pocket computer, notebook computer, or other handheld terminal.

While the present invention has been described in terms of preferred embodiments, it should be understood that the invention is not limited to those preferred embodiments, but extends to various modifications that nevertheless fall within the scope of the appended claims. For example, FIG. 7 indicates that NMOS transistors are used to form a rectifying device and bulk terminal control circuit. Alternatively, however, PMOS transistors may be used instead of the NMOS transistors.

In the contactless electronic device shown in FIG. 1, a plurality of semiconductor integrated circuit devices may be used to form the power supply circuit, receiver, transmitter, controller, and memory. The present invention can be widely used as a semiconductor integrated circuit device or contactless electronic device having a temperature measurement function.

The meanings of the symbols used in the drawings for the present invention are described below:
B1, B2, B5: Bulk terminal control circuit
B3, B4: Unidirectional device
C1: Smoothing capacitance
C2: Resonant capacitance
D1-D4: pn-junction diode
L1: Antenna
LA, LB: Antenna terminal
M1-M12: MOS transistor
P1, P2: Period
VDS1-VDS3: Drain-to-source voltage
VDD: High potential side output terminal of the rectifier
VSS: Low potential side output terminal of the rectifier
U1: Contactless electronic device
U2: Semiconductor integrated circuit device
U3: Power supply circuit
U4: Internal circuit
U5: Rectifier
U6: Regulator
U7: Receiver circuit
U8: Transmitter circuit
U9: Controller
U10: Memory
U11: Printed circuit board
U12: Coil
U13: IC chip
U14: Interrogator
U15: Semiconductor integrated circuit device
U16: Coil formed by a wiring layer on the semiconductor integrated circuit device
U17: Cellular phone
U18: Folding-type housing for the cellular phone U17
U19: Input device
U20: Contactless electronic device
W1-W6: Voltage waveform
Z1: Load circuit

What is claimed is:

1. A semiconductor integrated circuit device having a rectifier for converting AC voltage to DC voltage, the semiconductor integrated circuit comprising:
a first power supply line for receiving the AC voltage;
a second power supply line for receiving the AC voltage;
a reference line;
a first MOS transistor that is positioned between the first power supply line and the reference line and whose gate is connected to the second power supply line;
a second MOS transistor that is positioned between the second power supply line and the reference line and whose gate is connected to the first power supply line;
a first unidirectional device, one terminal of which is connected to the first power supply line and the other terminal of which is connected to an output terminal of the rectifier;

a second unidirectional device, one terminal of which is connected to the second power supply line and the other terminal of which is connected to an output terminal of the rectifier; and control means for applying an AC voltage input to the first power supply line or an AC voltage input to the second power supply line, whichever is lower, to a bulk terminal of the first or second MOS transistor that is activated upon application of the AC voltage.

2. The semiconductor integrated circuit device according to claim 1, wherein the unidirectional devices comprise a pn-junction diode.

3. The semiconductor integrated circuit device according to claim 1, wherein the unidirectional devices comprise a MOS transistor whose gate and drain are interconnected.

4. A semiconductor integrated circuit device having a function of rectifying an alternate current that is input from the outside, the semiconductor integrated circuit comprising:
a first input terminal for receiving the alternate current;
a second input terminal for receiving the alternate current;
a first output terminal connected to a ground terminal;
a second output terminal which outputs the alternate current that is rectified;
a first unidirectional device connected to the first input terminal via a first wire and provided with a function of causing a unidirectional current flow from the first input terminal to the second output terminal;
a second unidirectional device connected to the second input terminal via a second wire and provided with a function for causing a unidirectional current flow from the second input terminal to the second output terminal;
a first MOS transistor whose gate is connected to the first wire, whose source is connected to the second wire, and whose drain is connected to the first output terminal;
a second MOS transistor whose gate is connected to the second wire, whose source is connected to the first wire, and whose drain is connected to the first output terminal;
a first bulk terminal control circuit, one terminal of which is connected to the first wire, another terminal of which is connected to the second wire, and an output terminal of which is connected to a bulk terminal of the first MOS transistor; and
a second bulk terminal control circuit, one terminal of which is connected to the first wire, another terminal of which is connected to the second wire, and an output terminal of which is connected to a bulk terminal of the second MOS transistor;
wherein the first and second bulk terminal control circuits exercise control so as to apply an AC voltage input to the first input terminal or an AC voltage input to the second input terminal, whichever is lower, to a bulk terminal of the first or second MOS transistor that is activated upon application of the alternate current.

5. The semiconductor integrated circuit device according to claim 4, wherein the first or second bulk terminal control circuit exercises control to apply a voltage so that no forward current flows to a junction that is formed by a first electrically conductive layer, which forms a source region for the first or second MOS transistor, and a second electrically conductive layer to which a bulk potential is applied.

6. The semiconductor integrated circuit device according to claim 4, wherein the unidirectional devices comprise a pn-junction diode.

7. The semiconductor integrated circuit device according to claim 4, wherein the unidirectional devices comprise a MOS transistor whose gate and drain are interconnected.

8. The semiconductor integrated circuit according to claim 4, wherein the bulk terminal control circuits include:
a seventh MOS transistor which is positioned between the first wire and an output terminal of the bulk terminal control circuit and whose gate is connected to the second wire; and
an eighth MOS transistor which is positioned between the second wire and an output terminal of the bulk terminal control circuit and whose gate is connected to the first wire.

9. The semiconductor integrated circuit device according to claim 4, wherein the bulk terminal control circuits comprise a first bulk terminal control circuit for controlling the bulk terminal potential of the first MOS transistor, and a second bulk terminal control circuit for controlling the bulk terminal potential of the second MOS transistor;
wherein the first bulk terminal control circuit is positioned between the first and second wires and is such that a third MOS transistor whose gate is connected to the second wire and a fourth MOS transistor whose gate is connected to the first wire are parallel-connected with a drain used commonly; and
wherein the second bulk terminal control circuit is positioned between the first and second wires and is such that a fifth MOS transistor whose gate is connected to the second wire and a sixth MOS transistor whose gate is connected to the first wire are parallel-connected with a drain used commonly.

* * * * *